United States Patent
Kim

(10) Patent No.: US 6,528,371 B2
(45) Date of Patent: Mar. 4, 2003

(54) METHOD FOR FABRICATING SEMICONDUCTOR DEVICE

(75) Inventor: Young Gwan Kim, Chungcheongbuk-do (KR)

(73) Assignee: Hyundai Electronics Industries Co., Ltd., Kyoungki-do (KR)

(*) Notice: Subject to any disclaimer, the term of this patent is extended or adjusted under 35 U.S.C. 154(b) by 0 days.

(21) Appl. No.: 09/732,935

(22) Filed: Dec. 11, 2000

(65) Prior Publication Data

US 2002/0011634 A1 Jan. 31, 2002

(30) Foreign Application Priority Data

Jul. 29, 2000 (KR) .............................. 00-44016

(51) Int. Cl.[7] ............................. H01L 21/336
(52) U.S. Cl. .................. 438/283; 438/157; 438/176
(58) Field of Search ............................. 438/283, 157, 438/176, 199, 217, 218, 230–233, 265; 257/369, 172

(56) References Cited

U.S. PATENT DOCUMENTS

| 4,672,419 A | 6/1987 | McDavid |
| 4,874,720 A | 10/1989 | McDavid |
| 5,350,702 A | 9/1994 | Kim |
| 6,174,775 B1 * | 1/2001 | Liaw ............................ 438/283 |
| 6,214,671 B1 * | 4/2001 | Sun ............................. 438/261 |
| 6,265,325 B1 * | 7/2001 | Cao et al. ..................... 438/763 |
| 6,300,184 B1 * | 10/2001 | Choi et al. .................... 438/233 |

* cited by examiner

Primary Examiner—David Nelms
Assistant Examiner—Dung Anh Le
(74) Attorney, Agent, or Firm—Birch, Stewart, Kolasch & Birch, LLP

(57) ABSTRACT

A method for fabricating a semiconductor device in which channel resistance is prevented from occurring due to impurity ion diffusion and gate resistance is reduced, thereby improving the speed characteristic of the device. The method for forming a dual gate of a semiconductor device includes the steps of forming a polysilicon layer on a semiconductor substrate; selectively forming an impurity ion layer of a first conductive type and an impurity ion layer of a second conductive type on a lower surface to the polysilicon layer; polishing the polysilicon layer; forming a low resistance metal layer on the polished polysilicon layer; forming a first gate electrode and a second gate electrode by an etching process using a gate mask; and forming source/drain regions of the first conductive type in the substrate at both sides of the first gate electrode and source/drain regions of the second conductive type in the substrate at both sides of the second gate electrode.

12 Claims, 5 Drawing Sheets

METHOD FOR FABRICATING SEMICONDUCTOR DEVICE

BACKGROUND OF THE INVENTION

1. Field of the Invention

The present invention relates to a semiconductor device, and more particularly, to a method for fabricating a semiconductor device in which gate resistance is easily reduced and a gate is easily defined when forming a dual gate is.

2. Background of the Related Art

Generally, a dynamic random access memory (DRAM) tends toward a rapid increase of high packing density. The increase in high packing density accompanies a reduction of the area and size of the device. The reduction in the size of the device causes a degradation of device characteristics.

With the decrease of a channel, the gate is reduced. For this reason, gate resistance is increased. An increase in the gate resistance is directly related to the speed of the device. In the case of a buried channel PMOS transistor based on N+ polysilicon, the degradation of the device due to a short channel effect becomes serious.

To solve such a problem, n-polysilicon and p-polysilicon are respectively used as gate formation materials for NMOS and PMOS transistors. To improve the gate resistance, either a polycide gate or a salicide gate is formed.

However, in view of a later trend in which the design rule is reduced, it is difficult to define a gate, especially in the case of a polycide, if the aspect ratio is increased.

A related method for fabricating a semiconductor device will be described with reference to the accompanying drawings.

As shown in FIG. 1a, device isolation regions 12 are formed in a semiconductor substrate 11 of a first conductive type, utilizing the trench isolation process. A well region 13 is selectively formed within the semiconductor substrate 11 by ion implantation of a second conductive type.

As shown in FIG. 1b, a gate insulating film 14, a polysilicon layer 15 on which impurity ions are not doped, and a cap insulating film 16 are sequentially formed on the entire surface of the semiconductor substrate 11. Then, a first mask layer 17 is formed for gate doping of a PMOS transistor, and impurity ions of the first conductive type, for example, boron (B) ions, are doped on the polysilicon layer 15 by impurity ion implantation using the first mask layer 17.

As shown in FIG. 1c, the first mask layer is removed, and a second mask layer 17a is formed for gate doping of an NMOS transistor. Impurity ions of the second conductive type, for example, arsenic (As) ions or phosphorous (P) ions are doped on the polysilicon layer 15 by impurity ion implantation using the second mask layer 17a.

Subsequently, as shown in FIG. 1d, the polysilicon layer 15 is patterned by a photo etching process to form a gate electrode 15a of the PMOS transistor and a gate electrode 15b of the NMOS transistor.

As shown in FIG. 1e, a lightly doped drain (LDD) region 18a of the first conductive type is formed within the surface of the semiconductor substrate 11 at both sides of the gate electrode 15a of the PMOS transistor, and an LDD) region 18b of the second conductive type is formed within the surface of the semiconductor substrate 11 at both sides of the gate electrode 15b of the NMOS transistor. At this time, the LDD region 18a of the first conductive type and the LDD region 18b of the second conductive type are selectively formed using a mask.

As shown in FIG. 1f, an insulating film is deposited on the entire surface including the gate electrode 15a of the PMOS transistor and the gate electrode 15b of the NMOS transistor. The insulating film is then etched back to form sidewalls 19 at both sides of the gate electrodes 15a and 15b. Subsequently, first source/drain regions 20 and 20a are formed within the substrate at both sides of the gate electrode 15a of the PMOS transistor by conducting a heavily doped impurity ion implantation of the first conductive type. Also, second source/drain regions 21 and 21a are formed within the substrate at both sides of the gate electrode 15b of the NMOS transistor by conducting a heavily doped impurity ion implantation of the second conductive type. Thus, the related art process for fabricating a semiconductor device is completed. Thus, the fire source/drain regions 20 and 20a and the second source/drain regions 21 and 21a are formed by impurity ion implantation using respectively different masks.

However, the related art method for fabricating a semiconductor device has several problems.

First, after the undoped polysilicon layer is formed, the boron ions, having a high diffusion speed, are diffused into the channel region through the grain and tie grain boundary of the polysilicon layer during ion implantation for the formation of P polysilicon and N polysilicon. This increases channel resistance irregularly.

Second, in case where the silicide layer is formed on the gate electrode to reduce the gate resistance, it is necessary to remove the cap insulating film, thereby causing an inconvenience. In the case where the silicide is formed in a state where the cap insulating film is not completely removed the gate resistance is increased rather than reduced. In other words, in a general tendency in which the area of the gale electrode gradually becomes smaller, the formation of such an unstable silicide layer causes the gate resistance to be increased.

SUMMARY OF THE INVENTION

Accordingly, the present invention is directed to a method for fabricating a semiconductor device that substantially obviates one or more of the problems due to limitations and disadvantages of the related art.

Accordingly, an object of the present invention is to provide a semiconductor device and a method for fabricating a semiconductor device in which channel resistance is prevented from occurring due to impurity ion diffusion and a reduction in gate resistance, thereby improving speed characteristics of the device.

Additional advantages, objects, and features of the present invention will be set forth in part in the description which follows and in part will become apparent to those having ordinary skill n the art upon examination of the following or may be learned from the practice of the invention.

To achieve these and other advantages and in accordance with the purpose of the present invention, as embodied and broadly described, a method for forming a dual gate of a semiconductor device according to the present invention includes the steps of: forming a polysilicon layer on a semiconductor substrate; selectively forming an impurity ion layer of a first conductive type and an impurity ion layer of a second conductive type on a lower surface of the polysilicon layer, polishing the polysilicon layer; forming a low resistance metal layer on the polished potysilicon layer, forming a first gate electrode and a second gate electrode by an etching process using a gate mask; and forming source/drain regions of the first conductive type in the substrate at both sides of the first gate electrode and source/drain regions of the second conductive type in the substrate at both sides of the second gate electrode.

The process for selectively forming the impurity ion layer of the first conductive type and the impurity ion layer of the second conductive type on the lower surface of the polysilicon layer includes the steps of forming a first mask to partially expose the polysilicon layer, implanting impurity ions of the first conductive type into the lower surface of the exposed polysilicon layer by controlling the ion implantation energy, removing the first mask, forming a second mask to expose the polysilicon layer on which the impurity ions of the first conductive type are not doped, and implanting impurity ions of the second conductive type into the lower surface of the exposed polysilicon layer by controlling the ion in plantation energy.

The polishing step is performed by a chemical mechanical polishing (CMP) process, and the low resistance metal layer is either tungsten (W) or titanium (Ti).

Also, before forming the low resistance metal layer, the step of forming a barrier layer on the polysilicon layer is further provided.

The first gate electrode is formed of the polysilicon layer on which the impurity ions of the firs conductive type are doped, with the low residence metal layer disposed thereon, and the second gate electrode is foiled of the polysilicon layer on which the impurity ions of the second conductive type are doped with the low resistance metal layer disposed thereon.

It is to be understood that both the foregoing general description and the following detailed description are exemplary and explanatory and are not intended to limit the scope of the present invention.

BRIEF DESCRIPTION OF THE DRAWINGS

The present invention will now be described with reference to the following drawings, wherein.

DETAILED DESCRIPTION OF PREFERRED EMBODIMENTS

Figure 1A:
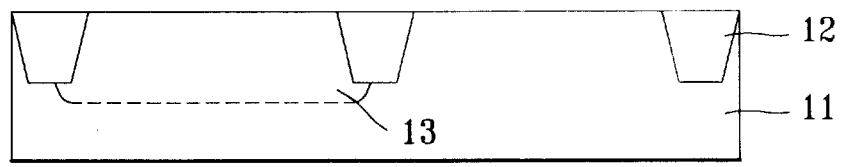
FIGS. 1a to 1f are sectional views illustrating a related art method for fabricating a semiconductor device.
Figure 1B:
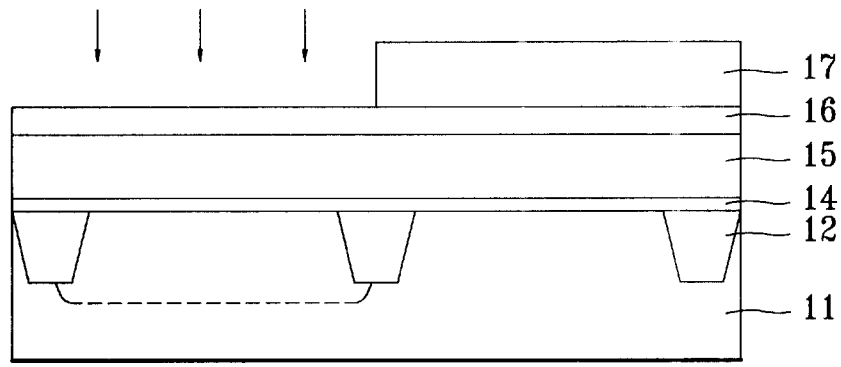
Figure 1C:
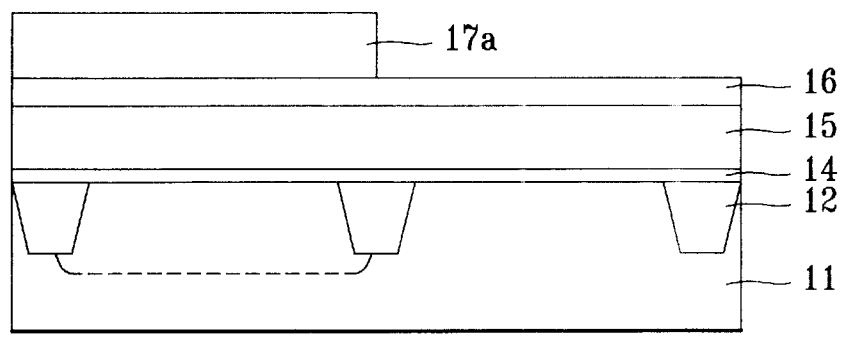
Figure 1D:
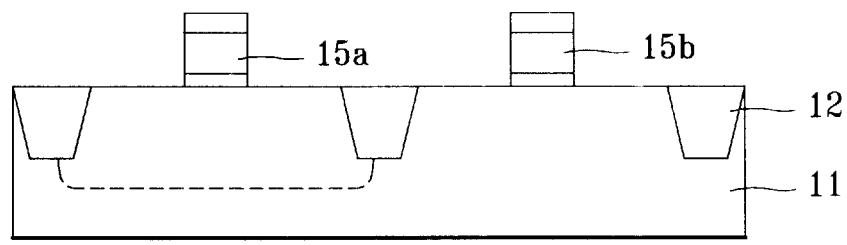
Figure 1E:
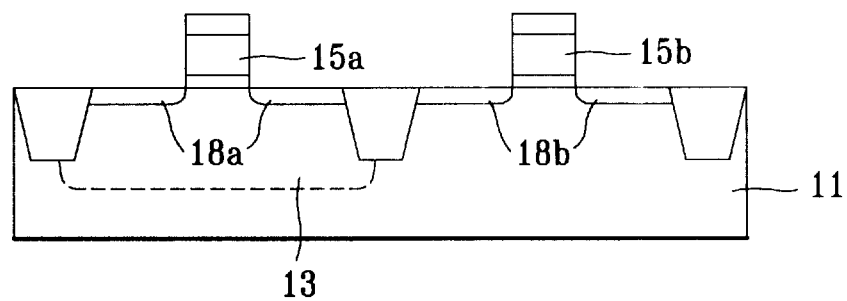
Figure 1F:
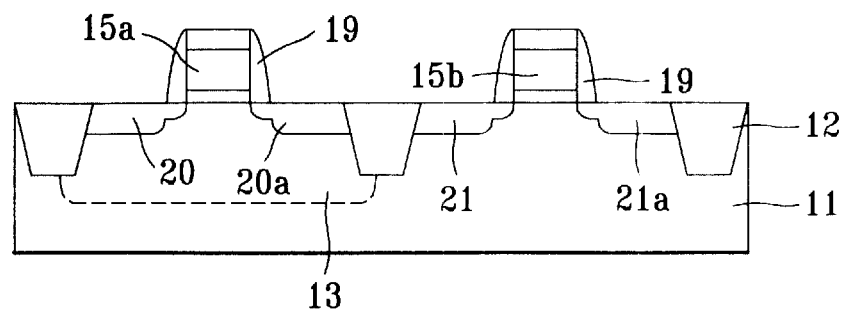

Reference will now be made in detail to the preferred embodiments of the present invention wherein like reference numerals are utilized throughout the various Figures to designate like elements.

FIGS. 2a to 2i are sectional views illustrating the method for fabricating a semi conductor device according to the present invention.

Figure 2A:
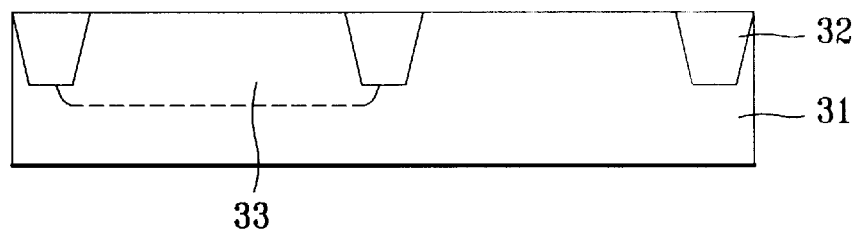
FIGS. 2a to 2i are sectional views illustrating a method for fabricating a semiconductor device according to the present invention.

As shown in FIG. 2a, device isolation regions 32 are formed on a semiconductor substrate 31 of a first conductive type by a trench isolation process. A well region 33 of a second conductive type is selectively formed in a predetermine region of the semiconductor substrate 31, by ion implantation.

Figure 2B:
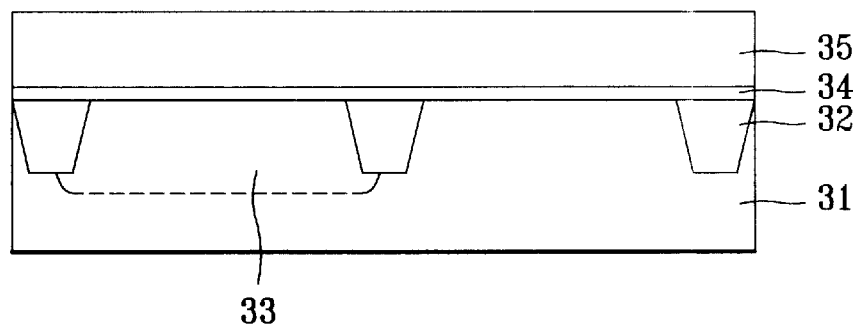

As shown in FIG. 2b, a gate insulating film 34 is formed on the semiconductor substrate 31, and an undoped polysilicon layer 35 on which impurity ions are not doped is formed on the gate insulating film 34. At this time, the polysilicon layer is formed to be thicker than a desired polygate.

Figure 2C:
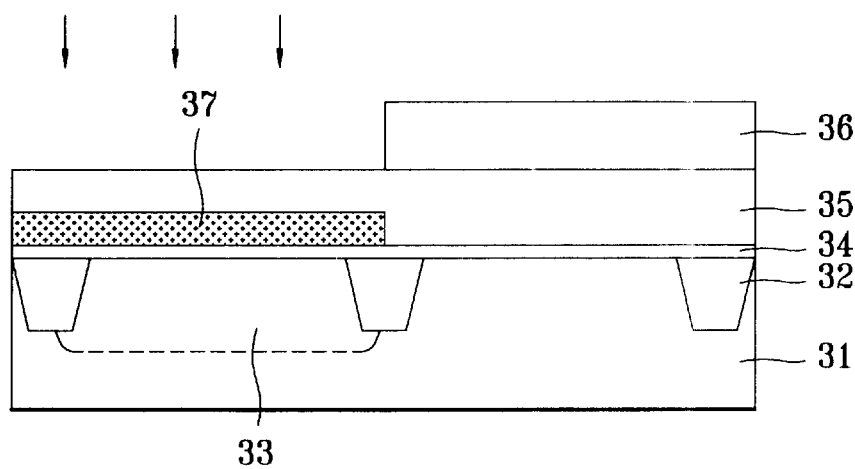

Subsequently, as shown in FIG. 2c, the polysilicon layer 35 is defined by a first region and a second region. A photoresist is then deposited on the polysilicon layer 35. A first mask pattern 36 is formed by exposure and developing processes to expose the polysilicon layer of the first region.

Then, an impurity ion layer 37 of the first conductive type is formed at the lower surface of the exposed polysilicon layer 35 by ion implantation using the first mask pattern 36. At this time, the first region is defined to sufficiently cover the well region 33, and the ion implantation energy is properly controlled to implant the impurity ions of the first conductive type into only the lower surface of the polysilicon layer 35.

Figure 2D:
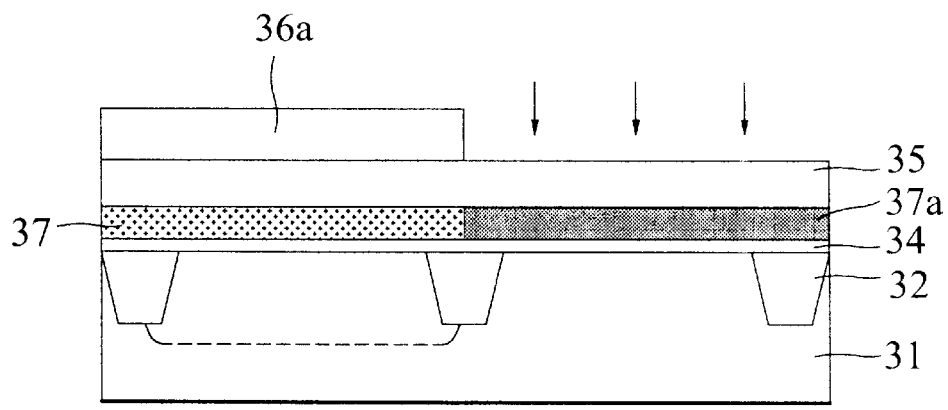

Afterwards, as shown in FIG. 2d, the first mask pattern 36 is removed, and then a second mask pattern 36a is formed on an upper surface of the polysilicon layer 35 to mask the region where the first mask pattern 36 was formed.

An impurity ion layer 37a of a second conductive type is formed at the lower surface of the exposed polysilicon layer 35 by ion implantation using the second mask pattern 36a. In the same manner as the formation of the impurity ion layer of the first conductive type, the ion implantation energy is controlled so that impurity ions of the second conductive type are implanted into the, lower surface of the polysilicon layer 35.

Figure 2E:
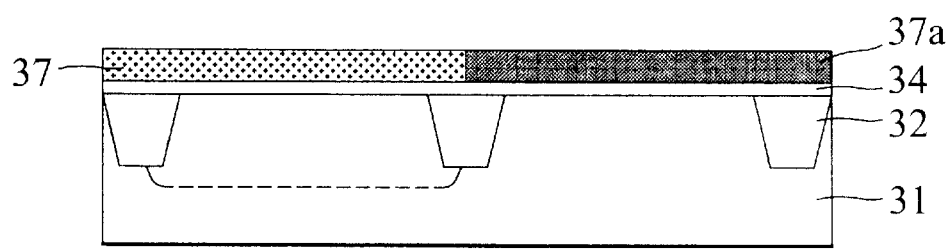

Subsequently, as shown in FIG. 2e, the second mask pattern 36a is removed, and then the polysilicon layer 35 is polished by CMP process until the surfaces of the impurity ion layers 37 and 37a are exposed.

Figure 2F:
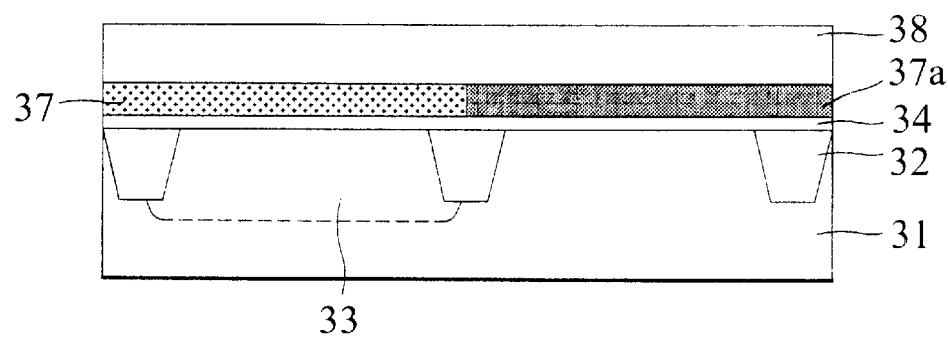

Afterwards, as shown in FIG. 2f, a low resistance metal layer 38 of tungsten (W) is formed on the polished polysilicon layer, i.e., the impurity ion layers 37 and 37a. In addition to tungsten, titanium (Ti) may also be used.

At the time, although riot shown, a barrier layer may be formed on the polysilicon layer to prevent the polysilicon layer from reacting with the low resistance metal layer, before the low resistance metal layer 38 is formed. The barrier layer is made of either tungsten nitride or titanium nitride.

Figure 2G:
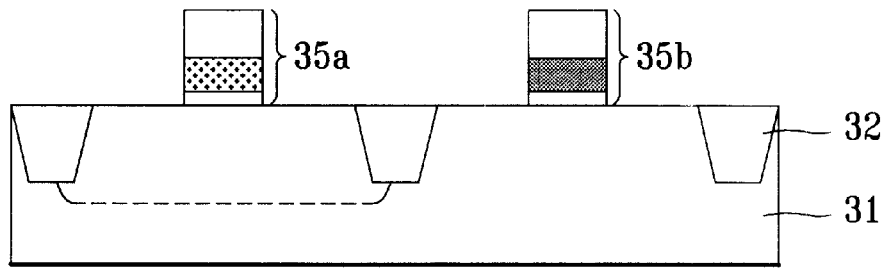
Figure 2H:
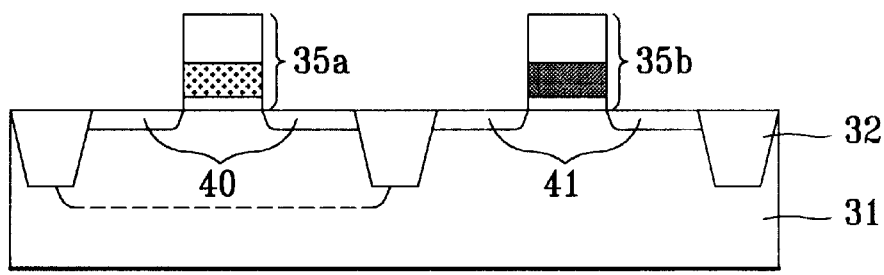

As shown in FIG. 2g, a photoresist (not shown) is deposited on the low resistance metal layer 38, and then a gate mask is formed by exposure and developing processes. A first gate electrode 35a and a second gate electrode 35b are formed by an etching process using the gate mask.

At this time, the first gate electrode 35a is formed of the polysilicon layer on which the impurity ions of the first conductive type are doped and the low resistance metal layer, and the second gate electrode 35b is formed of the polysilicon layer on which the impurity ions of the second conductive type are dope and the low resistance metal layer.

Subsequently, as shown in FIG. 2b, an LDD region 40 of the first conductive type is formed within the well region 33 of the second conductive type at both sides of the first gate electrode 35a, and an LDD region 41 of the second conductive type is formed within the semiconductor substrate 31 at both sides of the second gate electrode 35b.

At this time, the LDD region 40 of the first conductive type is formed using the first mask pattern 36 which was used for impurity ion implantation of the first conductive type, and the LDD region 41 of the second conductive type is formed using the second mask pattern 36a which was used for impurity ion implantation of the second conductive type.

Figure 2I:
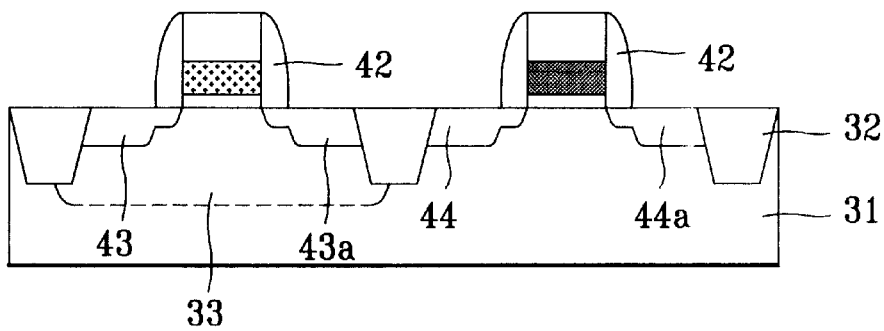

As shown in FIG. 2i, an insulating film is deposited on the entire surface of the semiconductor substrate including the first gate electrode 35a and the second gate electrode 35b.

The insulating film is then etched back to form insulating sidewalls 42 at both sides of the gate electrodes 35a and 35b.

Thereafter, source/drain regions 43 and 43a of three first conductive type are formed within the well region 33 of the second conductive type at both sides of the first gate electrode 35a, and source/drain regions 44 and 44a of the second conductive type are formed within the semiconductor substrate 31 at both sides of the second gate electrode 35b. Thus, the process for fabricating a semiconductor device according to the present invention is completed.

Here, the source/drain regions 43 and 43a of the first conductive type are formed using the first mask pattern 36 used for formation of the LDD region 40 of the first conductive type, and the source/drain regions 44 and 44a are formed using the second mask pattern 36a used for formation of the LDD region 41 of the second conductive type.

As aforementioned, the method for fabricating a semiconductor device according to the present invention has various advantages.

First, since tungsten having low sheet resistance and thermal stability is used to reduce gate resistance without performing the salicide process, abnormal resistance increase due to the salicide process can be avoided. Second, since ion implantation is performed in the thick polysilicon layer, an increase of channel resistance caused by channeling through the grain or grain boundary can be avoided.

Finally, the thickness of the gate electrode becomes smaller and thus the aspect ratio becomes low. Thus, it is easy to define a region for forming the gate electrode. Consequently, it is possible to reduce gate delay in a design rule of 0.1 $\mu$m or less.

The foregoing embodiments and advantages are merely exemplary and are not to be construed as limiting the present invention. The present teaching can be readily applied to other types of apparatus. The description of the present invention is intended to be illustrative, and not to limit the scope of the invention. Many alternatives, modifications and variations will be apparent to those skilled in the art.

What is claimed is:

1. A method for forming a dual gate of a semiconductor device, which comprises:

forming a polysilicon layer on a semiconductor substrate;

selectively forming an impurity ion layer of a first conductive type and an impurity ion layer of a second conductive type on a lower surface of the polysilicon layer;

polishing the polysilicon layer;

forming a barrier layer on the polysilicon layer, the barrier layer being either tungsten nitride or titanium nitride;

forming a low resistance metal layer on the polished polysilicon layer;

forming a first gate electrode and a second gate electrode by an etching process using a gate mask; and forming source/drain regions of the first conductive type in the substrate at both sides of the first gate electrode and source/drain regions of the second conductive type in the substrate at both sides of the second gate electrode.

2. The method of claim 1, wherein the step of selectively forming the impurity ion layer of the fist conductive type and the impurity ion layer of the second conductive type on the lower surface of the polysilicon layer includes the steps of:

forming a first mask to partially expose the polysilicon layer;

implanting impurity ions of the first conductive type into the lower surface of the exposed polysilicon layer by controlling ion implantation energy;

removing the first mask;

forming a second mask to expose the polysilicon layer on which the impurity ions of the first conductive type are not doped; and implanting impurity ions of the second conductive type into the lower surface of the exposed polysilicon layer by controlling the ion plantation energy.

3. The method of claim 1, wherein the polishing step is performed by a CMP process.

4. The method of claim 1, wherein the low resistance metal layer is either tungsten(W) or titanium(Ti).

5. The method of claim 1, wherein the first gate electrode is formed of the polysilicon layer on which the impurity ions of the first conductive type are doped and on which the low resistance metal layer is disposed, and the second gate electrode is formed of the polysilicon layer on which the impurity ions of the second conductive type are doped and on which the low resistance metal layer is disposed.

6. The method of claim 1, further comprising the step of forming device isolation regions and a well region before forming the polysilicon layer.

7. The method of claim 1, wherein the polysilicon layer is an undoped polysilicon layer.

8. A method for fabricating a semiconductor device, which comprises:

forming device isolation regions on a semiconductor substrate of a first conductive type;

forming a well region of a second conductive type in a predetermined region within the semiconductor substrate;

forming a gate insulating film and a polysilicon layer on the semiconductor substrate;

defining the polysilicon layer into a first region and a second region;

forming an ion implantation layer of the first conductive type on a lower surface of the first region;

forming an ion implantation layer of the second conductive type on the lower surface of the second region;

polishing the polysilicon layer to expose the ion implantation layers;

forming a barrier layer on the polysilicon layer, the barrier layer being either tungsten nitride or titanium nitride;

forming a tungsten layer on the polished polysilicon layer;

forming a first gate electrode and a second gate electrode by an etching process using a gate mask; and forming source/drain regions of the first conductive type within the well region of the second conductive type at both sides of the first gate electrode and source/drain regions of the second conductive type in the substrate at both sides of the second gate electrode.

9. The method of claim 8, wherein the polishing step is performed by a CMP process.

10. The method of claim 8, wherein the first region covers the well region of the second conductive type.

11. The method of claim 8, wherein the device isolation regions are formed by a trench isolation process.

12. The method of claim 8, wherein the polysilicon layer is an undoped polysilicon layer.

* * * * *